US012684845B2

(12) United States Patent　　(10) Patent No.:　US 12,684,845 B2
Lee　　(45) Date of Patent:　Jul. 14, 2026

(54) POWER SEMICONDUCTOR DEVICE AND METHOD FOR MANUFACTURING THE SAME

(71) Applicant: HYUNDAI MOBIS CO., LTD., Seoul (KR)

(72) Inventor: Ju Hwan Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 361 days.

(21) Appl. No.: 18/382,664

(22) Filed: Oct. 23, 2023

(65) Prior Publication Data

US 2024/0136405 A1　　Apr. 25, 2024
US 2024/0234511 A9　　Jul. 11, 2024

(30) Foreign Application Priority Data

Oct. 24, 2022　(KR) ......................... 10-2022-0137178

(51) Int. Cl.
*H10D 62/832*　　(2025.01)
*H10D 12/01*　　(2025.01)
*H10D 30/66*　　(2025.01)
*H10D 62/10*　　(2025.01)

(52) U.S. Cl.
CPC ....... *H10D 62/8325* (2025.01); *H10D 12/031* (2025.01); *H10D 30/668* (2025.01); *H10D 62/102* (2025.01)

(58) Field of Classification Search
CPC ............. H10D 62/8325; H10D 62/102; H10D 30/668; H10D 12/031

USPC .......................................................... 257/77
See application file for complete search history.

(56) References Cited

U.S. PATENT DOCUMENTS

| | | | |
|---|---|---|---|
| 9,887,287 B1 * | 2/2018 | Lichtenwalner ..... | H10D 62/126 |
| 2014/0361349 A1 * | 12/2014 | Alexandrov ......... | H10D 62/106 |
| | | | 438/192 |
| 2018/0261666 A1 | 9/2018 | Zeng et al. | |
| 2019/0296110 A1 * | 9/2019 | Meiser ................. | H10D 30/665 |
| 2021/0091184 A1 * | 3/2021 | Hell ..................... | H10D 12/038 |
| 2022/0130996 A1 * | 4/2022 | Islam ................... | H10D 62/154 |
| 2022/0157959 A1 | 5/2022 | Kim et al. | |

OTHER PUBLICATIONS

Office Action issued in corresponding Korean Patent Application No. 10-2022-0137178 dated Sep. 29, 2025, with English translation.

* cited by examiner

*Primary Examiner* — Igwe U Anya
(74) *Attorney, Agent, or Firm* — MORGAN, LEWIS & BOCKIUS LLP

(57)　　ABSTRACT

A power semiconductor device includes a semiconductor layer formed of silicon carbide (SiC), a trench formed by etching the semiconductor layer, a gate formed in a manner that a partial region of the gate is buried in the trench and another partial region of the gate extends over the semiconductor layer, a shield region formed to surround a lower region of the trench, a well region disposed in the semiconductor layer to be in contact with a first side surface of the trench and an upper surface of the semiconductor layer, a source region disposed in the well region, and a shield connector formed to extend from an upper surface of the semiconductor layer to the shield region while contacting a second side surface opposite to the first side surface.

15 Claims, 8 Drawing Sheets

HORIZONTAL CHANNEL

VERTICAL CHANNEL

POWER SEMICONDUCTOR DEVICE AND METHOD FOR MANUFACTURING THE SAME

CROSS-REFERENCE TO RELATED APPLICATION

This application claims the benefit of priority to Korean Patent Application No. 10-2022-0137178, filed in the Korean Intellectual Property Office on Oct. 24, 2022, the entire contents of which are incorporated herein by reference.

TECHNICAL FIELD

Embodiments of the present disclosure relate to a semiconductor device, and more particularly, to a power semiconductor device for switching power transmission and a method for manufacturing the same.

BACKGROUND ART

A power semiconductor device is a semiconductor device operating in a high voltage and high current environment. The power semiconductor device is used in fields requiring high power switching, for example, power conversion systems, power converters, inverters, etc. For example, the power semiconductor device may include an insulated gate bipolar transistor (IGBT), a power MOSFET, and the like. The power semiconductor device requires basically breakdown characteristics to high voltage, and recently, additionally, a high-speed switching operation.

Accordingly, research on power semiconductor devices using silicon carbide (SiC) instead of conventional silicon (Si) has been conducted. Silicon carbide (SiC) is a wide-gap semiconductor material with a higher band gap than silicon, and can maintain stability even at high temperature compared to silicon. Furthermore, since silicon carbide has a very high dielectric breakdown field compared to silicon, the silicon carbide can stably operate even at high voltage compared to silicon. Therefore, silicon carbide has a higher breakdown voltage than silicon and excellent heat dissipation so that the silicon carbide can operate at high temperature.

In order to increase the channel density of a power semiconductor device using silicon carbide (SiC), a trench-type gate structure having a vertical channel structure has been intensively researched and proposed.

SUMMARY

Various embodiments of the present disclosure relate to a power semiconductor device made of silicon carbide (SiC), which can stably protect a lower portion of a gate by mitigating concentration of an electric field applied to a lower portion of a gate trench while increasing the channel density and mobility, and a method for manufacturing the same.

However, these tasks are disclosed only for illustrative purposes, and the scope of the present disclosure is not limited thereto.

In accordance with one aspect of the present disclosure, a power semiconductor device may include a semiconductor layer including silicon carbide (SiC), a trench in the semiconductor layer, a gate having a first region buried in the trench and a second region extending over the semiconductor layer, a shield region surrounding a lower region of the trench, a well region disposed in the semiconductor layer to be in contact with a first side surface of the trench and an upper surface of the semiconductor layer, a source region disposed in the well region, and a shield connector extending from the upper surface of the semiconductor layer to the shield region while contacting a second side surface opposite to the first side surface of the trench.

Preferably, the first region may include a recess gate buried in the trench and configured to form a vertical channel in the well region when operation power is received, and the second region may include a planar gate disposed over the semiconductor layer to be connected to the recess gate and configured to form a horizontal channel in the well region when the operation power is received.

Preferably, the planar gate may extend to cover the well region while connected to a partial region adjacent to the source region from an upper surface of the recess gate.

Preferably, the shield region is disposed in a manner such that the shield region protrudes from opposing sides of the trench in opposing directions, and both sides of the shield region are symmetrical with respect to the trench.

Preferably, the shield region includes: a first shield region including impurities at a first concentration; and a second shield region including impurities at a second concentration lower than the first concentration while surrounding the first shield region.

Preferably, the shield connector may include a first impurity region connected to the shield region and protrudes from the shield region toward the second side surface of the trench, a second impurity region connected to an upper region of the first impurity region and extends to the upper surface of the semiconductor layer, and a third impurity region disposed to contact the upper surface of the semiconductor layer in the second impurity region and includes impurities having a higher concentration than the first and second impurity regions.

Preferably, the power semiconductor device may further include a junction field effect transistor (JFET) region disposed between the well region and the shield region in the semiconductor layer.

Preferably, the semiconductor layer may include a silicon carbide (SiC) substrate, and a silicon carbide (SiC) epitaxial layer.

Preferably, the silicon carbide (SiC) epitaxial layer may include a field stopper and a drift region disposed over the field stopper.

Preferably, the power semiconductor device may further include a drain electrode disposed under the semiconductor layer, and a source electrode disposed over the gate and the semiconductor layer to be connected to the shield connector.

In accordance with another aspect of the present disclosure, a method for manufacturing a power semiconductor device may include forming a shield region by implanting impurities of a second conductivity type opposite to a first conductivity type into a semiconductor layer including silicon carbide (SiC) having the first conductivity type, forming a trench extending to an upper region of the shield region by etching the semiconductor layer, forming a shield connector connecting the shield region to an upper surface of the semiconductor layer by implanting impurities of the second conductivity type into one side of the trench; forming a well region spaced apart from the shield region by implanting the impurities of the second conductivity type into another side opposite to the one side of the trench, forming a source region by implanting impurities of the first conductivity type into the well region, and forming a gate in a manner such that a partial region of the gate is buried in the trench and another partial region of the gate extends over the semiconductor layer.

Preferably, the forming the shield region may include forming a double shield structure including an impurity region having a first concentration of the impurities of the second conductivity type, the impurity region is surrounded by another impurity region having a second concentration of the impurities of the second conductivity type lower than the first concentration.

Preferably, the forming of the trench may include etching the semiconductor layer to a position where a lower region of the trench is surrounded by the shield region.

Preferably, the forming of the shield connector may include forming a first impurity region that is connected to the shield region and protrudes only in one direction from the shield region, forming a second impurity region that is connected to the first impurity region and extends to the upper surface of the semiconductor layer, and forming a third impurity region in the second impurity region to be in contact with the upper surface of the semiconductor layer.

Preferably, the third impurity region has a concentration of the impurities of the second conductivity type higher than that of the second impurity region.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
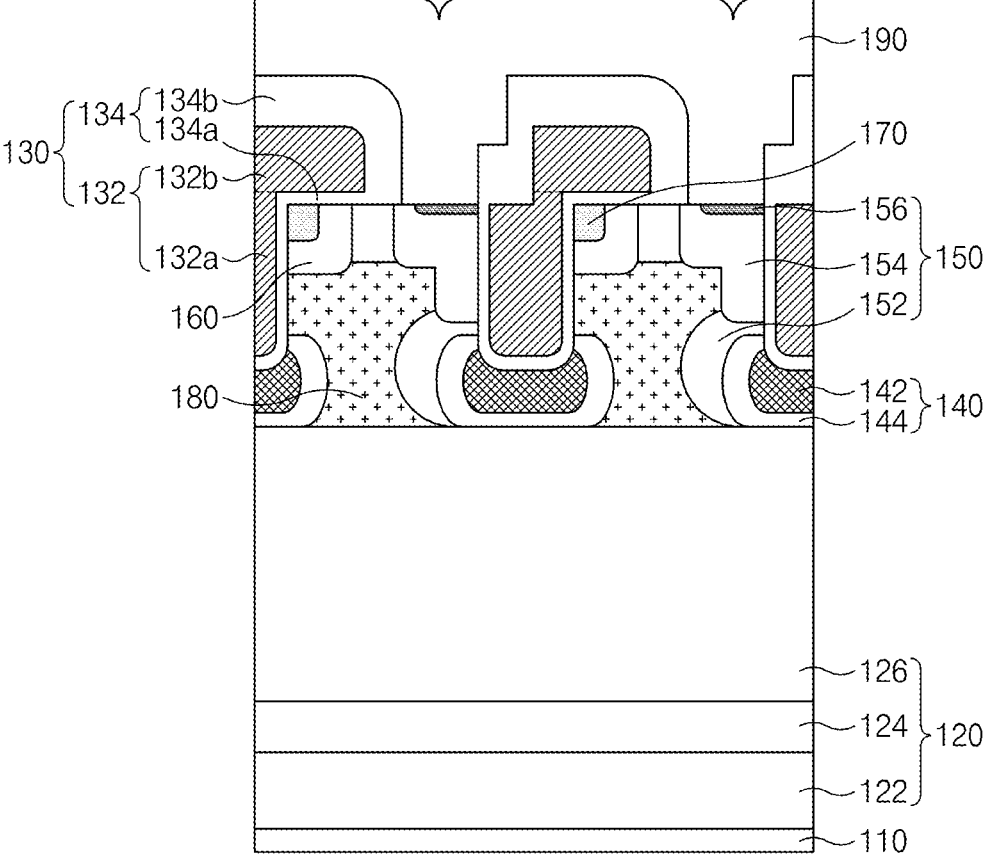
FIG. 1 is a cross-sectional view showing a power semiconductor device according to an embodiment of the present disclosure.

Hereinafter, an embodiment of the present disclosure will be described in detail with reference to the accompanying drawings. However, the present disclosure is not limited to the embodiments disclosed below, but may be implemented in various different forms. The following examples are provided to complete disclosure of the present disclosure, and to fully inform those of ordinary skill in the scope of the present disclosure. In addition, for convenience of description, at least some of the constituent elements may be exaggerated or reduced in size in the drawings. In the drawings, the same reference numerals refer to the same elements.

Unless otherwise defined, all terms used herein have the same meaning as commonly understood by one of ordinary skill in the art. In the drawings, the sizes of layers and regions are exaggerated for the sake of explanation, and thus are provided to explain the general structures of the present disclosure.

The same reference numerals denote the same elements. When referring to a configuration such as a layer, region, or substrate as being on another configuration, it will be understood that it is in the immediately upper trench of the other configuration or that there may also be other intervening configurations in between. On the other hand, when it is referred to as being "directly on" of another configuration, it is understood that there are no intervening configurations.

Figure 2:
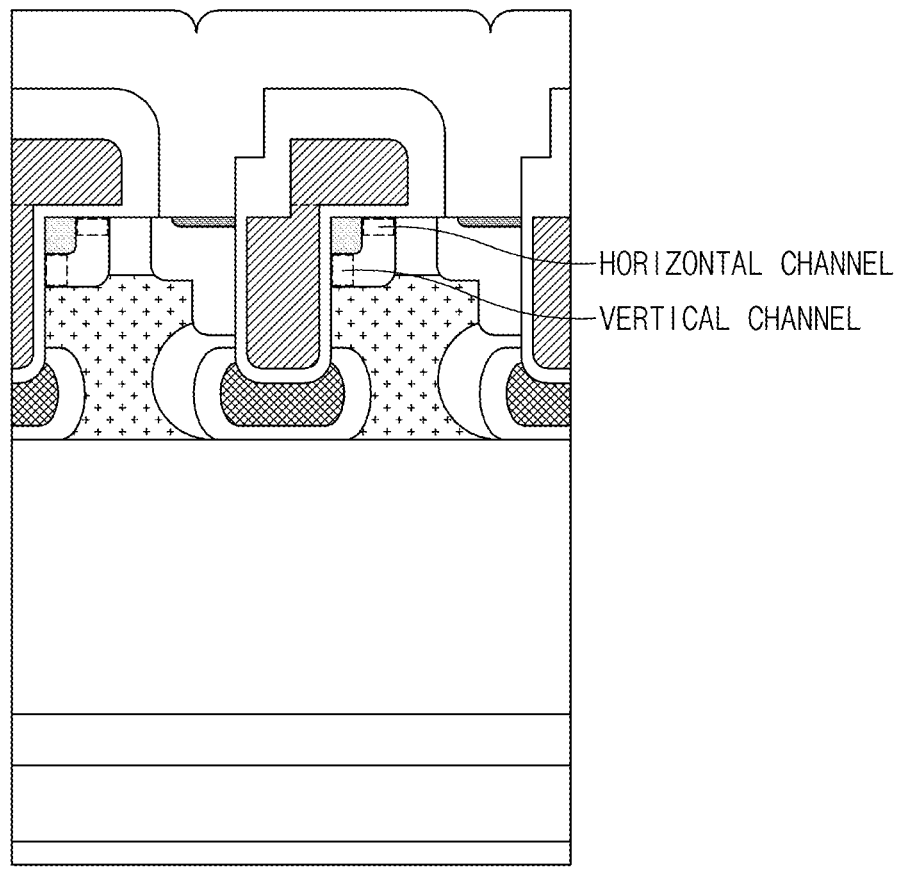
FIG. 2 is a cross-sectional view showing how a channel is formed in the power semiconductor device of FIG. 1.

FIG. 1 is a cross-sectional view showing a power semiconductor device according to an embodiment of the present disclosure, and FIG. 2 is a cross-sectional view showing how a channel is formed in the power semiconductor device of FIG. 1. electrode Referring to FIGS. 1 and 2, the power semiconductor device may include a drain electrode 110, a semiconductor layer 120, a gate 130, an insulation layer shield region 140, a shield connector 150, a well region 160, a source region 170, a junction field effect transistor (JFET) region 180, and a source electrode 190.

The semiconductor layer 120 may include one or multiple semiconductor material layers. For example, the semiconductor layer 120 may include one or multiple epitaxial layers. The semiconductor layer 120 may include one or multiple epitaxial layers on a semiconductor substrate. For example, the semiconductor layer 120 may include a silicon carbide (SiC) substrate. Alternatively, the semiconductor layer 120 may include at least one epitaxial layer formed of silicon carbide (SiC).

Silicon carbide (SiC) has a larger band gap than silicon (Si), so that the silicon carbide can maintain stability even at high temperature compared to silicon. Furthermore, silicon carbide (SiC) has a very high dielectric breakdown field compared to silicon, so that the silicon carbide can operate stably even at high voltage. Therefore, the power semiconductor device designed to use silicon carbide (SiC) as a semiconductor layer 120 has a higher breakdown voltage and more excellent heat dissipation characteristics than the other power semiconductor device in which silicon instead of silicon carbide is used, and can exhibit more stable operation characteristics even at high temperature.

The semiconductor layer 120 may include a semiconductor substrate 122, a field stopper 124 formed over the semiconductor substrate 122, and a drift region 126 formed over the field stopper 124. Each of the semiconductor substrate 122, the field stopper 124, and the drift region 126 may include impurities of a first conductivity type (N). For example, the semiconductor substrate 122 may include first conductivity-type impurities having $N^+$-type concentrations, the field stopper 124 may include first conductivity-type impurities having N-type concentrations, and the drift region 126 may include first conductivity-type impurities having $N^-$-type concentrations. The semiconductor substrate 122 may include a silicon carbide (SiC) substrate, and each of the field stopper 124 and the drift region 126 may include a silicon carbide (SiC) epitaxial layer grown on the silicon carbide (SiC) substrate. The drift region 126 may provide a movement path of a current during operation of the power semiconductor device.

A drain electrode 110 may be formed under the substrate layer 122. The drain electrode 110 may include a conductive material such as metal.

The gate 130 may be formed to extend over the semiconductor layer 120 while being buried in a gate trench. The gate 130 may include a gate electrode 132 and a gate insulation layer 134.

The gate electrode 132 may include a recess gate 132a and a planar gate 132b. The recess gate 132a may be formed to be buried in a gate trench in which the semiconductor layer 120 is etched to a predetermined depth. As such, the recess gate 132a may be formed to extend to a predetermined length in a vertical direction from an upper surface of the semiconductor layer 120, so that a vertical channel can be formed in a well region 170 when an operation voltage is applied to the power semiconductor device. The planar gate 132b may be formed over the semiconductor layer 120 so as to be connected to the recess gate 132a. For example, the planar gate 132b may be formed to extend from an upper surface of the recess gate 132a to an upper surface of the semiconductor layer 120. The planar gate 132b may extend over the semiconductor layer 120 in a manner that the planar gate 132b is connected to the upper surface of the recess gate 132 and covers the source region 160 and the well region 170, so that a horizontal channel can be formed in the well region 170 when the operation voltage is applied to the power semiconductor device. In this case, the planar gate 132b may extend only in one direction without extending in both directions of the recess gate 132a. The planar gate 132b may not be formed to cover the entirety of the upper surface of the recess gate 132a, but may be formed to be connected to only a portion of the upper surface of the recess gate 132a.

As such, since the gate electrode 132 may include the recess gate 132a and the planar gate 132b, the vertical channel and the horizontal channel are formed as shown in FIG. 2 when the operation voltage is applied to the power semiconductor device, so that a high channel density and mobility can be guaranteed. In addition, the gate electrode 132 may form a vertical channel and a horizontal channel only at one side of the gate trench because the planar gate 132b extends only in one direction. The gate electrode 132 may include polysilicon doped with impurities.

The gate insulation layer 134 may be formed to surround the gate electrode 132. The gate insulation layer 134 may include a lower gate insulation layer 134a and an upper gate insulation layer 134b. The lower gate insulation layer 134a may represent a region formed between the gate electrode 132 and the semiconductor layer 120. For example, the lower gate electrode 134a may include a region formed between the recess gate 132a and the semiconductor layer 120 in the gate trench, and a region formed between a bottom surface of the planar gate 132b and the semiconductor layer 120 on the semiconductor layer. The upper gate insulation layer 134b may represent a region that covers the upper surface of the recess gate 132a and the top and side surfaces of the planar gate 132b. The gate insulation layer 134 may include an insulating material such as silicon oxide, silicon carbide oxide, silicon nitride, hafnium oxide, zirconium oxide, or aluminum oxide, or may include a stacked structure thereof.

Although the above-described embodiment has disclosed only one gate 130 for convenience of description, a plurality of gates 130 may be consecutively formed at regular intervals along the X-axis direction. Each gate 130 may be formed to extend in a line shape along the Y-axis direction.

An insulation layer shield region 140 may be formed under each recess gate 132a in the drift region 126 of the semiconductor layer 120. Preferably, the insulation layer shield region 140 may be formed to surround a lower portion (e.g., a bottom surface and lower sidewalls adjacent to the bottom surface) of the gate trench in which each recess gate 132a is formed. The insulation layer shield region 140 may be formed to protrude from both side surfaces of the gate trench in both directions of the gate trench, and both sides of the insulation layer shield region 140 may be formed symmetrically with respect to the gate trench. The insulation layer shield region 140 may include impurities of a second conductivity type (P-type) opposite to the first conductivity type (N-type).

The insulation layer shield region 140 may have a double shield structure that includes a first shield region 142 and a second shield region 144 surrounding the first shield region 142. The first shield region 142 may include impurities of the second conductivity type with a high concentration, and the second shield region 144 may include impurities of the second conductivity type with a lower concentration than the first shield region 142. Although FIG. 1 shows that the bottom surface of the insulation layer shield region 140 and the bottom surface of the JFET 180 are located at the same level for convenience of description, the scope or spirit of the present disclosure is not limited thereto.

When the operation voltage is applied to the gate electrode 132, an electric field may be concentrated at a lower surface (especially, at a corner portion) of the recess gate 132a. When the electric field is concentrated at the corner portion of the recess gate 132a, the gate insulation layer 134 in the corresponding region is subjected to severe stress, which may cause dielectric breakdown of the gate insulation layer 134. Therefore, the lower region of the gate trench in which the recess gate 134 is formed may be surrounded by the impurity region 140 of a type opposite to the impurity type of the semiconductor layer 120, thereby reducing concentration of the electric field applied to the corner portion of the recess gate 132a and preventing dielectric breakdown of the gate insulation layer 134.

A shield connector 150 may be formed only at one side of the gate trench in the drift region 126, and may be formed to extend from an upper surface of the semiconductor layer 120 to the insulation layer shield region 140 in a manner that the insulation layer shield region 140 is connected to the source electrode 190, thereby enabling a source potential to be applied to the insulation layer shield region 140. The shield connector 150 may include a plurality of impurity regions 152 to 156. The impurity regions 152 to 156 may include impurities of the second conductivity type.

In the present embodiment, the impurity region 152 may be formed only in one direction of the gate trench while being connected to the insulation layer shield region 140. For example, the insulation layer shield region 140 may be formed to be horizontally symmetrical with respect to the gate trench, whereas the impurity region 152 may be asymmetrically formed to protrude only in one direction of the gate trench. The impurity region 154 may be formed to extend to an upper surface of the semiconductor layer 120 while being connected to an upper portion of the impurity region 152. The impurity region 156 may be formed to contact the upper surface of the semiconductor layer 120 in an upper region of the impurity region 154. The impurity region 156 may include impurities of the second conductivity type having a higher concentration than the impurity regions (152, 154), and may serve as a plug formed to interconnect the impurity region 154 and the source electrode 190.

As described above, according to the present embodiment, a channel may be formed only in one region of both regions of the gate trench, and a shield connector 150 for applying a source potential to the insulation layer shield region 140 may be formed in the other region, so that the lower region of the gate 130 can be more stably protected. In addition, according to the present embodiment, a planar gate 132b may be formed on the upper surface of the semiconductor layer 120 to be connected to the recess gate 132a in a manner that two channels (i.e., a vertical channel and a horizontal channel) are formed in the well region 160 located at one side of the gate trench. As a result, a decrease in channel density and mobility, which may occur when the channel is formed only at one side of the gate trench, can be prevented.

The well region 160 may be a region in which channels (i.e., a vertical channel and a horizontal channel) are formed to allow a current to move between the drift region 126 and the source region 170 when an operation voltage is applied to the gate electrode 132. The well region 160 may be formed at the other side (opposite to the shield connector 150) of the gate trench in the drift region 126. The well region 160 may be formed to contact the other side of the recess gate 132*a* and the gate insulation layer 134 located at the bottom surface of the planar gate 132*b*. Therefore, when the operation voltage is applied to the gate electrode 132, a vertical channel may be formed at the other side of the recess gate 132*a* in the well region 160 and a horizontal channel may be formed under the planar gate 132*b*, as shown in FIG. 2. The well region 160 may include impurities of the second conductivity type.

The source region 170 may be formed in the well region 110 to contact the other side (opposite to the shield connector 150) of the recess gate 132*a* and the gate insulation layer 134 located at the bottom surface of the planar gate 132*b*. The source region 170 may include the first conductivity-type impurities having a higher concentration than the drift region 126. The source region 170 may be connected to the source electrode 190. For example, the source electrode 170 may extend to be longer than the gate electrode 132 so that the source electrode 170 can be electrically connected to the source electrode 190 at the end of the extended portion.

The JFET region 180 may be formed between the recess gates 132*a* in an upper region of the drift region 170. For example, in the drift region 170 between the adjacent recess gates 132*a*, a JFET region 180 for improving conduction characteristics may be formed as a charge storage structure in regions other than the insulation layer shield region 140, the shield connector 150, and the well region 160. The JFET region 180 may include the first conductivity-type impurities having a higher concentration than the drift region 126. Although FIG. 1 shows that the bottom surface of the JFET region 180 has the same level as the bottom surface of the insulation layer protection region 140 for convenience of description, the scope or spirit of the present disclosure is not limited thereto.

The source electrode 190 may be formed on the semiconductor layer 120 and the gate 130 to be connected to the shield connector 150. The source electrode 190 may be electrically connected to the source region 170. The source electrode 190 may include a conductive material such as metal.

FIGS. 3A to 3F are cross-sectional views showing a method for manufacturing the power semiconductor device of FIG. 1 according to an embodiment of the present disclosure.

Figure 3A:
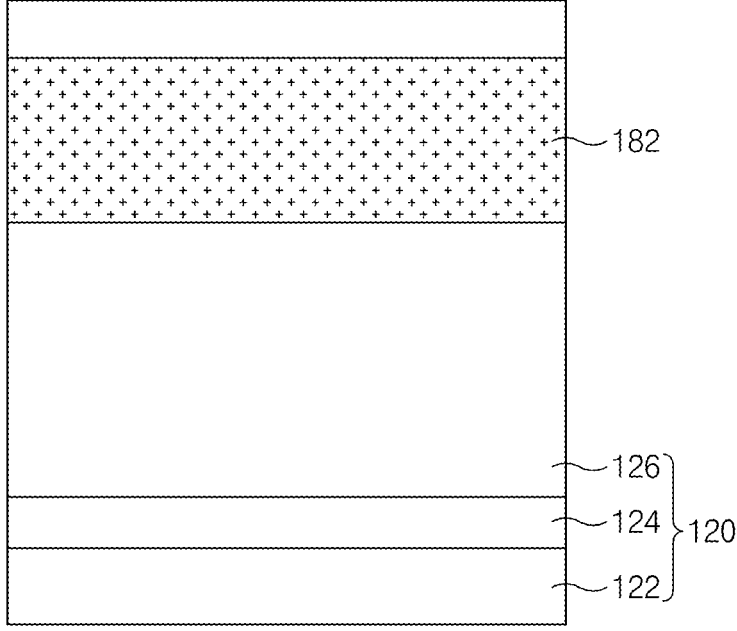
FIGS. 3A to 3F are cross-sectional views showing a method for manufacturing the power semiconductor device of FIG. 1 according to an embodiment of the present disclosure.

Referring to FIG. 3A, in the semiconductor layer 120 in which the semiconductor substrate 122, the field stopper 124, and the drift region 126 are sequentially stacked, an N-well region 183 may be formed by implanting the first conductivity-type impurities having a higher concentration than the drift region 126 into an upper region of the drift region 126. A portion of the N-well region 182 may serve as the JFET region. For example, the remaining region other than the P-type impurity regions (140, 150) to be formed in a subsequent process may serve as the JFET region.

In this case, the semiconductor substrate 122 may include a silicon carbide (SiC) substrate, and each of the field stopper 124 and the drift region 126 may include an epitaxial layer formed of silicon carbide (SiC). The semiconductor substrate 122, the field stopper 124, and the drift region 126 may include N⁺, N, and N⁻ conductivity types, respectively.

Figure 3B:
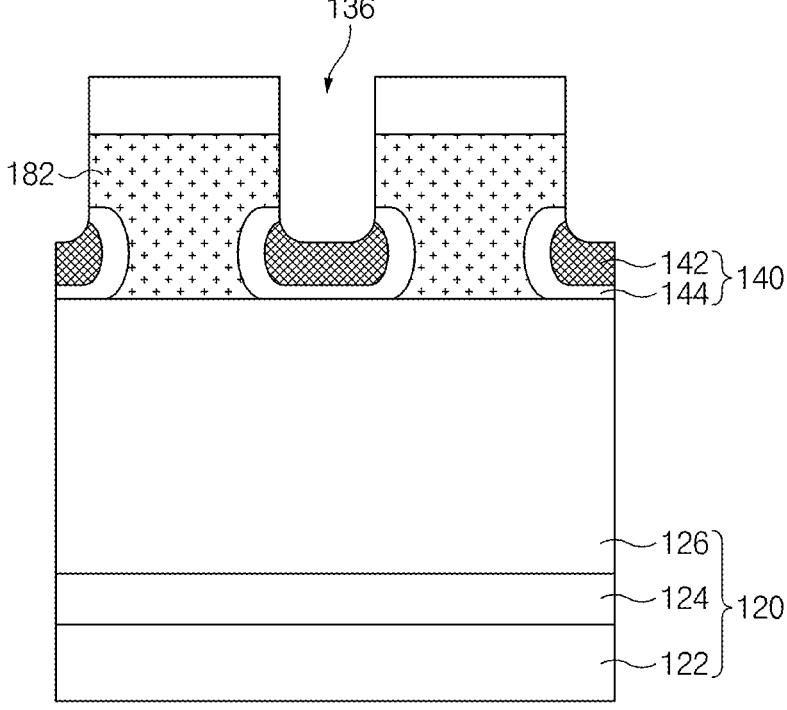

Referring to FIG. 3B, a structure in which the insulation layer shield region 140 surrounds a lower region of the gate trench 136 in the drift region 126 may be formed.

For example, after P-type impurities are implanted into the drift region 126 to form the insulation layer shield region 140 at a predetermined depth within the drift region 126, the semiconductor layer may be etched to an upper portion of the insulation layer shield region 140, such that a gate trench 136 having a lower region surrounded by the insulation layer shield region 140 can be formed. In this case, the insulation layer shield region 140 may be formed as a double shield structure in which a high-concentration P-type impurity region (hereinafter referred to as a first shield region) 142 is surrounded by a P-type impurity region (hereinafter referred to as a second shield region) 144 having a lower concentration than the first shield region 142.

Alternatively, after the gate trench 136 having a predetermined depth is formed in the drift region 126, impurities of the second conductivity type are implanted into the drift region 126 through the lower region of the trench 136, thereby forming the insulation layer shield region 140.

Figure 3C:
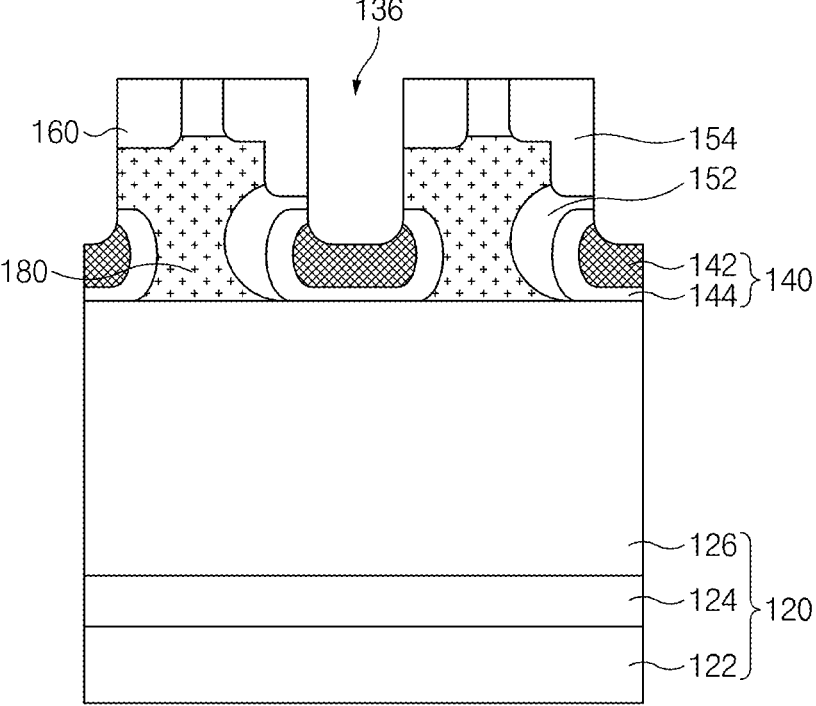

Referring to FIG. 3C, impurities of the second conductivity type may be implanted into the drift region 126 to form a well region 160 at one side of the gate trench 136, and impurity regions (152, 154) of the shield connector 150 may be formed at the other side of the gate trench 136.

For example, impurities of the second conductivity type are implanted into only one side of the trench 136 through the gate trench 136 so that the impurities can be connected to the insulation layer shield region 140, resulting in formation of an impurity region 152 that protrudes only toward one side of the insulation layer shield region 140.

Subsequently, the second conductivity-type impurities may be additionally implanted into the semiconductor layer 120 to form an impurity region 154 extending from the upper surface of the semiconductor layer 120 to the impurity region 152. In this case, the well region 160 may be formed by implanting the second conductivity-type impurities into the opposite side of the gate trench 136.

Figure 3D:
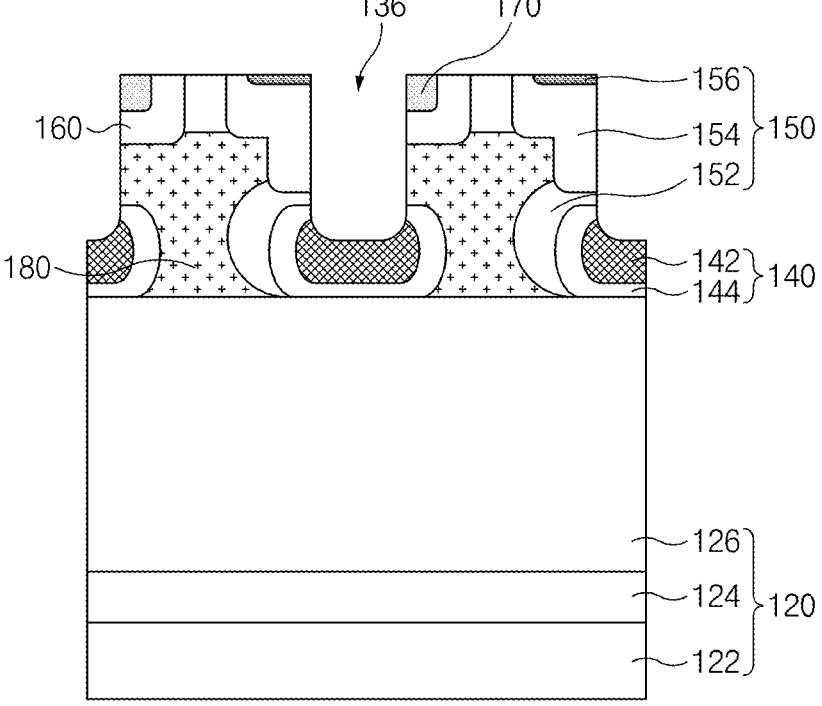

Referring to FIG. 3D, a second conductivity-type impurity region 156 having a high concentration may be formed in an upper region of the impurity region 154, and a source region 170 may be formed in an upper region of the well region 160. The source region 170 may include high-concentration impurities of the first conductivity type.

Figure 3E:
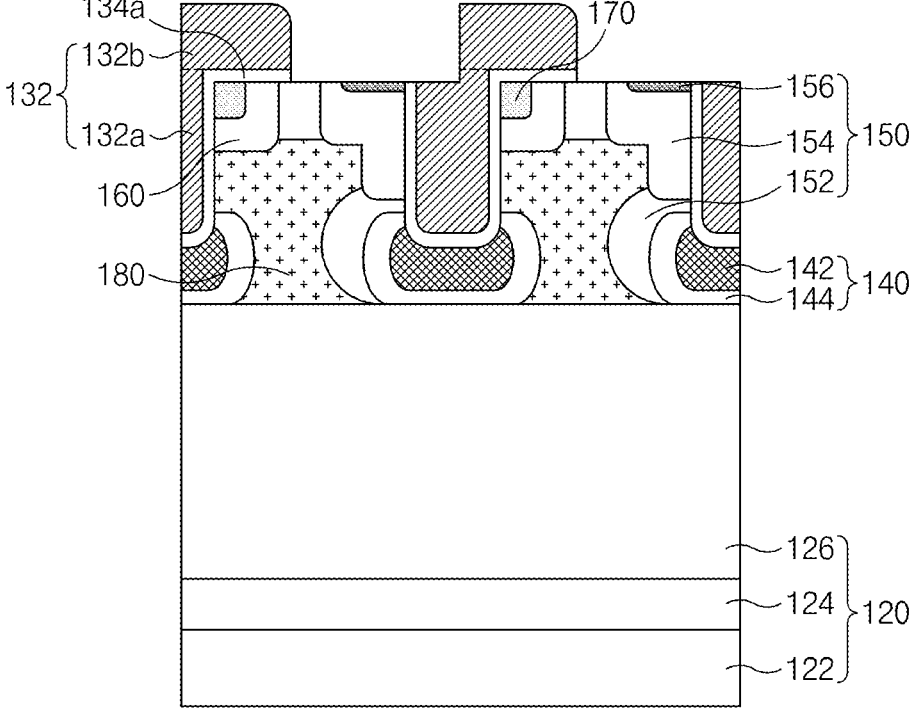

Referring to FIG. 3E, a gate electrode 132 extending over the semiconductor layer 120 while being buried in the gate trench 136 may be formed.

For example, an insulation layer may be formed not only on the inner surfaces (e.g., side and bottom surfaces) of the gate trench 136, but also on the upper surface of the semiconductor layer 120, and a metal layer may be formed entirely on the insulation layer to fill the gate trench 136. Subsequently, the gate electrode 132 and the lower gate insulation layer 134*a* may be formed by patterning the metal layer and the insulation layer that are formed on the semiconductor layer 120. In this case, a portion buried in the gate trench 136 may become a recess gate 132*a*, and a portion formed over the semiconductor layer 120 may become a planar gate 132*b*.

Figure 3F:
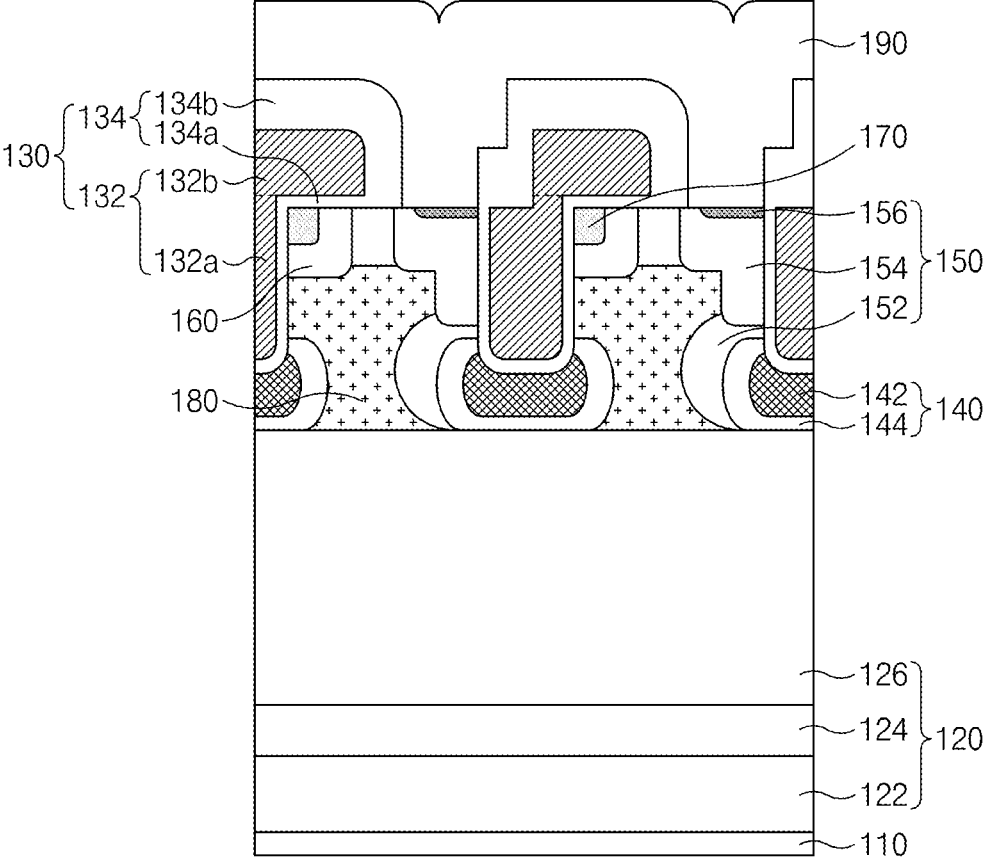

Referring to FIG. 3F, a source electrode 190 may be formed over the gate electrode 132 and a drain electrode 110 may be formed under the semiconductor layer 120.

For example, after the insulation layer is formed over the gate electrode 132 and the semiconductor layer 120, the insulation layer may be etched to expose the impurity region 156, resulting in formation of an upper gate insulation layer 134*b*.

Subsequently, a source electrode 190 may be formed over the gate 130 and the semiconductor layer 120 in a manner that the source electrode 190 can be connected to the impurity region 156 while entirely covering the gate 130. A drain electrode 110 may be formed under the semiconductor layer 120 to be in contact with the semiconductor substrate 122.

As is apparent from the above description, the power semiconductor device and the method for manufacturing the same according to the embodiments of the present disclosure can stably protect a lower portion of a gate by mitigating concentration of an electric field applied to a lower portion of a gate trench while increasing the channel density and mobility.

The effect is illustrative, and the scope of the present disclosure is not limited thereby.

Of course, these effects are merely examples, and the scope of the present disclosure is not limited thereto.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
a semiconductor layer including silicon carbide (SIC);
a trench in the semiconductor layer;
a gate having a first region buried in the trench and a second region extending over the semiconductor layer;
a shield region surrounding a lower region of the trench;
a well region disposed in the semiconductor layer to be in contact with a first side surface of the trench and an upper surface of the semiconductor layer;
a source region disposed in the well region to contact with the first side surface of the trench; and
a shield connector extending from the upper surface of the semiconductor layer to the shield region while contacting a second side surface opposite to the first side surface of the trench,
wherein the second region of the gate covers top surfaces of the source region and the well region as a whole.

2. The power semiconductor device according to claim 1, wherein the first region includes a recess gate buried in the trench and configured to form a vertical channel in the well region when operation power is received; and
the second region includes a planar gate disposed over the semiconductor layer to be connected to the recess gate and configured to form a horizontal channel in the well region when the operation power is received.

3. The power semiconductor device according to claim 2, wherein:
the planar gate extends to cover the well region and the source region while connected to a partial region adjacent to the source region from an upper surface of the recess gate.

4. The power semiconductor device according to claim 1, wherein:
the shield region is disposed in a manner such that the shield region protrudes from opposing sides of the trench in opposing directions, and both sides of the shield region are symmetrical with respect to the trench.

5. The power semiconductor device according to claim 1, wherein the shield region includes:
a first shield region including impurities at a first concentration; and
a second shield region including impurities at a second concentration lower than the first concentration while surrounding the first shield region.

6. The power semiconductor device according to claim 1, wherein the shield connector includes:
a first impurity region connected to the shield region and protrudes from the shield region toward the second side surface of the trench;
a second impurity region connected to an upper region of the first impurity region and extends to the upper surface of the semiconductor layer; and
a third impurity region disposed to contact the upper surface of the semiconductor layer in the second impurity region and includes impurities having a higher concentration than the first and second impurity regions.

7. The power semiconductor device according to claim 1, further comprising:
a junction field effect transistor (JFET) region disposed between the well region and the shield region in the semiconductor layer.

8. The power semiconductor device according to claim 1, wherein the semiconductor layer includes:
a silicon carbide (SiC) substrate; and
a silicon carbide (SiC) epitaxial layer.

9. The power semiconductor device according to claim 8, wherein the silicon carbide (SiC) epitaxial layer includes:
a field stopper; and
a drift region disposed over the field stopper.

10. The power semiconductor device according to claim 1, further comprising:
a drain electrode disposed under the semiconductor layer; and
a source electrode disposed over the gate and the semiconductor layer to be connected to the shield connector.

11. A method for manufacturing a power semiconductor device comprising:
forming a shield region by implanting impurities of a second conductivity type opposite to a first conductivity type into a semiconductor layer including silicon carbide (SiC) having the first conductivity type;
forming a trench extending to an upper region of the shield region by etching the semiconductor layer;
forming a shield connector connecting the shield region to an upper surface of the semiconductor layer by implanting impurities of the second conductivity type into one side of the trench;
forming a well region spaced apart from the shield region by implanting the impurities of the second conductivity type into another side opposite to the one side of the trench;
forming a source region by implanting impurities of the first conductivity type into the well region to contact with the first side surface of the trench; and
forming a gate in a manner such that a partial region of the gate is buried in the trench and another partial region of the gate extends over the semiconductor layer,
wherein the source region is disposed to contact with a sidewall of the trench, and the another partial region of the gate covers top surfaces of the source region and the well region as a whole.

12. The method according to claim 11, wherein the forming of the shield region includes:

forming a double shield structure including an impurity region having a first concentration of the impurities of the second conductivity type, the impurity region is surrounded by another impurity region having a second concentration of the impurities of the second conductivity type lower than the first concentration.

13. The method according to claim 11, wherein the forming of the trench includes:

etching the semiconductor layer to a position where a lower region of the trench is surrounded by the shield region.

14. The method according to claim 11, wherein the forming of the shield connector includes:

forming a first impurity region that is connected to the shield region and protrudes only in one direction from the shield region;

forming a second impurity region that is connected to the first impurity region and extends to the upper surface of the semiconductor layer; and forming a third impurity region in the second impurity region to be in contact with the upper surface of the semiconductor layer.

15. The method according to claim 14, wherein:

the third impurity region has a concentration of the impurities of the second conductivity type higher than that of the second impurity region.

* * * * *